US006924684B1

(12) United States Patent
Nguyen

(10) Patent No.: US 6,924,684 B1
(45) Date of Patent: Aug. 2, 2005

(54) COUNTER-BASED PHASE SHIFTER CIRCUITS AND METHODS WITH OPTIONAL DUTY CYCLE CORRECTION

(75) Inventor: Andy T. Nguyen, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 10/696,227

(22) Filed: Oct. 28, 2003

Related U.S. Application Data

(63) Continuation-in-part of application No. 10/618,329, filed on Jul. 11, 2003.

(51) Int. Cl.[7] ............................................. H03H 11/16
(52) U.S. Cl. ...................... 327/241; 327/122; 327/299; 377/43
(58) Field of Search .................... 327/231, 234–236, 327/116–122, 291, 295–299; 331/53; 708/101, 708/103; 377/47–49, 43

(56) References Cited

U.S. PATENT DOCUMENTS

| | | | | |
|---|---|---|---|---|
| 3,952,253 A | | 4/1976 | DeVolpi et al. ............. 327/160 |
| 4,017,719 A | | 4/1977 | Kaplan et al. .............. 708/101 |
| 4,290,022 A | * | 9/1981 | Puckette ..................... 327/241 |
| 5,109,395 A | | 4/1992 | Tanaka ......................... 377/44 |
| 5,744,992 A | * | 4/1998 | Baumann .................... 327/241 |
| 5,898,329 A | | 4/1999 | Hopkins ...................... 327/176 |
| 6,023,199 A | | 2/2000 | Cheung ....................... 332/109 |
| 6,259,283 B1 | | 7/2001 | Nguyen ....................... 327/122 |
| 6,285,226 B1 | | 9/2001 | Nguyen ....................... 327/175 |
| 6,351,756 B1 | | 2/2002 | Taniyoshi ................... 708/103 |
| 6,426,660 B1 | | 7/2002 | Ho et al. ..................... 327/175 |
| 6,788,120 B1 | | 9/2004 | Nguyen ....................... 327/172 |

OTHER PUBLICATIONS

U.S. Appl. No. 10/651,811, filed Aug. 29, 2003, Nguyen.

* cited by examiner

*Primary Examiner*—Minh Nguyen
(74) *Attorney, Agent, or Firm*—Lois D. Cartier

(57) ABSTRACT

Phase shifter circuits and methods use counters to define the positions of the output clock edges. A plurality of counters are each clocked by a count clock relatively much faster than the input clock. A first counter counts for one input clock period, and a delay value is determined based at least in part on the counted value. In some embodiments, the delay value has a maximum value that depends on the counted value. The delay value is provided to a second counter, which counts from zero to the delay value and generates a pulse one delay value after the beginning of the input clock period. A third counter running at the same clock rate generates a pulse after an additional delay. The pulses from the counters are used to provide output clock edges at predetermined times during the input clock cycle. Some circuits also perform a duty cycle correction.

57 Claims, 14 Drawing Sheets

COUNTER-BASED PHASE SHIFTER CIRCUITS AND METHODS WITH OPTIONAL DUTY CYCLE CORRECTION

FIELD OF THE INVENTION

The invention relates to clock phase shifter circuits. More particularly, the invention relates to counter-based phase shifter circuits and methods optionally having duty cycle correction and maximum value capabilities.

BACKGROUND OF THE INVENTION

Clock signals are used in virtually every integrated circuit (IC) and electronic system to control timing. For example, every time a rising edge occurs on a clock signal, all the flip-flops in a circuit might change state. Therefore, clock signals are often distributed widely throughout an IC or system. When a clock signal is widely distributed, inherent delays often cause various portions of the IC or system to receive the clock signal at different times. Further, setup and hold requirements can vary between different destination circuits. For these and other reasons, it is often desirable to perform a phase adjustment on a clock signal.

Phase adjustments are typically performed using a phase-lock loop (PLL) or delay-lock loop (DLL) circuit. However, PLLs are analog in nature and take a long time to simulate, and a design that works in one manufacturing process may stop working when manufactured using another process. Therefore, PLLs are difficult to design, and often are not feasible in a given circuit or system. DLLs can also be complicated and difficult to design. Additionally, DLLs typically consume a great deal of silicon area. Therefore, clock phase adjustment is often not feasible using known circuits and methods.

Therefore, it is desirable to provide circuits and methods that enable a circuit designer to adjust the phase of an input clock signal without using a PLL or DLL, using a fairly simple circuit that consumes a relatively small amount of silicon area. Preferably, such circuits and methods can optionally be implemented using the logic resources included in a programmable logic device (PLD).

SUMMARY OF THE INVENTION

The invention provides phase shifter circuits and methods that use counters to determine the positions of the output clock edges. A phase shifter circuit accepts an input clock signal and provides an output clock signal having a phase delay (a predetermined offset) from the input clock signal, e.g., delayed by a specified amount. A phase shifter circuit according to an embodiment of the invention includes a plurality of counter circuits, each clocked by a count clock relatively much faster than the input clock signal. In some embodiments, each counter includes a small oscillator circuit implemented in the same fashion and generating a count clock for the counter. Thus, each counter uses a count clock having the same clock frequency.

A first counter is periodically enabled to count for one input clock period, and the counted value (or a value derived from the counted value) is stored in a register. The stored value can be, for example, the counted value, half the counted value, the counted value minus a decrement value, and so forth. The stored value represents a maximum delay, i.e., a maximum permissible number of counts for the phase delay to be applied to the input signal.

The applied delay between the input clock signal and the output clock signal (the "delay value") is either a set delay provided to the circuit (if no more than the maximum delay) or the maximum delay (if the set delay exceeds the maximum delay). The delay value is provided to a second counter that counts (for example) from zero to the delay value. Thus, the second counter generates a first pulse partway through the input clock period, i.e., one delay value after an initial (e.g., rising) edge on the input clock signal. The first pulse causes a first edge on the output clock signal. (The term "initial edge" is used herein to signify an edge on the input clock signal that is considered the starting point for the input clock period. The term "following edge" is used to signify the opposite edge from the initial edge.) A third counter running at the same clock rate then generates a second pulse at another time in the input clock cycle, as desired. This second pulse causes a second edge on the output clock signal.

In some embodiments, the third counter starts counting in response to a following (e.g., falling) edge on the input clock signal, and stops counting after one delay value. Thus, the pulse width of the output clock signal is the same as the pulse width of the input clock signal.

In other embodiments, the third counter starts counting in response to the pulse from the second counter (i.e., one delay value after the initial (e.g., rising) edge on the input clock signal) and stops counting after a delay of one-half of the input clock period. The length of one-half input clock period is derived from the number counted by the first counter. In these embodiments, the output clock signal has a 50 percent duty cycle. Therefore, these embodiments provide duty cycle correction (DCC).

In yet other embodiments, the duty cycle correction feature provides a different duty cycle correction (e.g., 25%), or can be enabled or disabled as desired.

Other embodiments of the invention provide related structures and methods of providing a phased output clock signal from an input clock signal.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
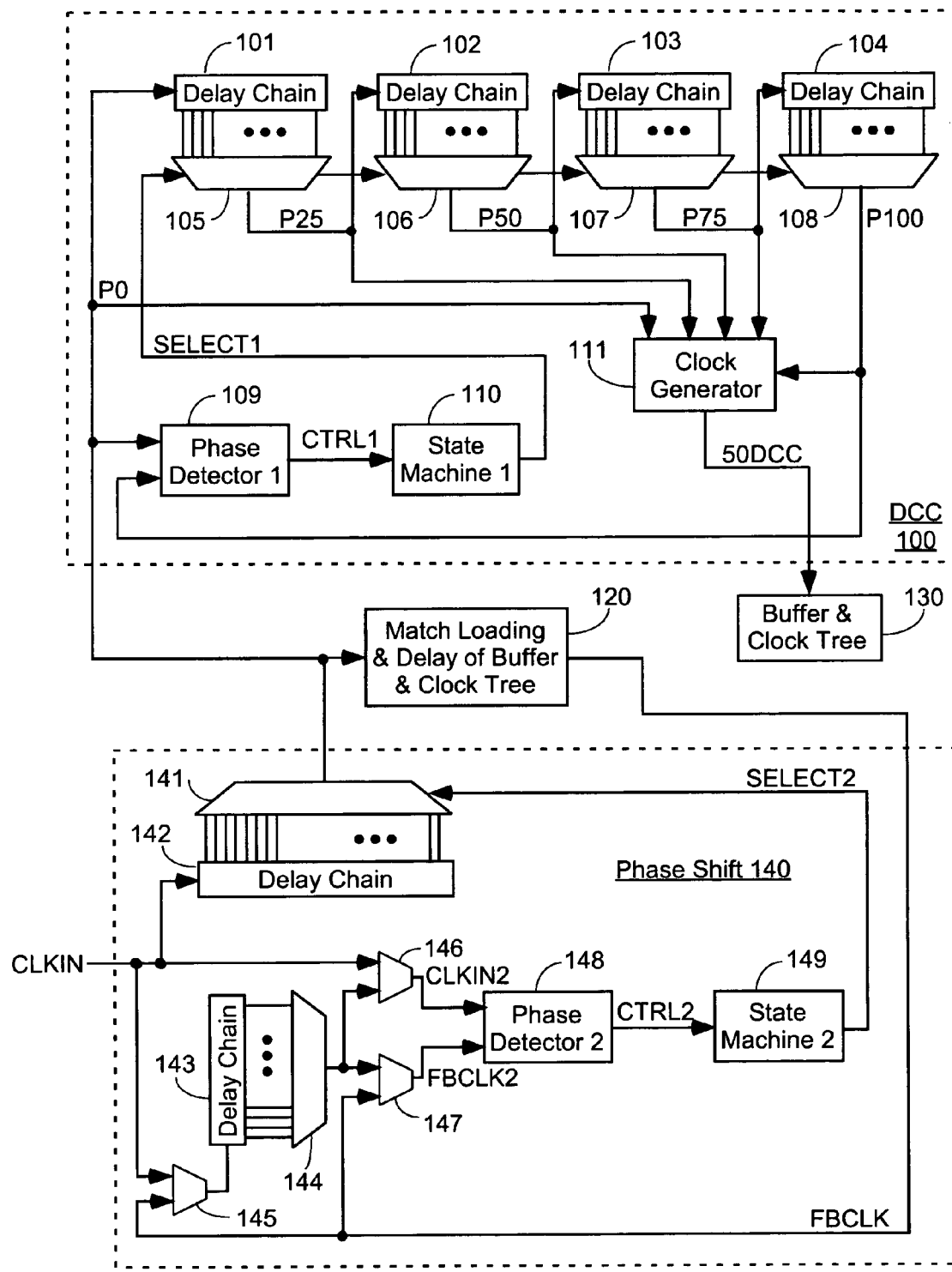
FIG. 1 illustrates a prior art phase shifter circuit that includes a delay lock loop (DLL).

FIG. 1 illustrates a known phase shifter circuit that includes a DLL and provides duty cycle correction (DCC). The phase shifter circuit of FIG. 1 includes a duty cycle correction (DCC) portion 100, a buffer and clock tree 130, a match element 120 that matches the delay and loading of the buffer and clock tree 130, and a phase shift portion 140.

The DCC portion accepts an input clock signal P0 from the phase shift portion and provides a DCC-corrected output signal 50DCC to the buffer and clock tree 130. Four delay chains 101–104 each provide 128 tap signals to an associated multiplexer 105–108, respectively. Multiplexers 105–108 are controlled by select signals SELECT1 to provide selected signals P25, P50, P75, and P100, respectively. Signal P100 is aligned with input signal P0. Signal P25 is offset by 90 degrees, signal P50 is offset by 180 degrees, and signal P75 is offset by 270 degrees from input signal P0.

Signals P0, P25, P50, P75, and P100 are provided to clock generator 111, which generates the DCC-corrected output signal 50DCC to the buffer and clock tree 130. Signal P100 is also provided to phase detector 1 (109), which compares signal P100 with input signal P0. Phase detector 1 (109) provides control signals CTRL1 (e.g., signals ADD1 and SUBTRACT1, not shown) indicating a phase relationship between signals P0 and P100. State machine 1 (110) receives control signals CTRL1 and provides signals SELECT1 that control multiplexers 105-108 to select the appropriately delayed clock signals P25, P50, P75, and P100.

Signal P0 is also provided to match element 120, which provides feedback clock signal FBCLK to phase shift portion 140. Phase shift portion 140 includes a 256-tap delay chain 142 and a 256-to-1 multiplexer 141 driven by the tap outputs from delay chain 142, a 128-tap delay chain 143 and a 128-to-1 multiplexer 144 driven by the tap outputs from delay chain 143, multiplexers 145–147, phase detector 2 (148), and state machine 2 (149).

Delay chain 142 and multiplexer 141 push all five signals P0, P25, P50, P75, and P100 forward to align signal FBCLK2 with signal CLKIN2. Delay chain 142 is driven by signal CLKIN, and multiplexer 141 is controlled by signals SELECT2 from state machine 2 (149). State machine 2 (149) sets the values of signals SELECT2 based on signals CTRL2 from phase detector 2 (148), which compares the phases of signals CLKIN2 and FBCLK2.

The phase shift is added by offsetting either signal CLKIN2 or signal FBCLK2 using delay chain 143 and multiplexer 144. Thus, delay chain 143 is driven by either signal CLKIN or signal FBCLK, with the selection being determined by multiplexer 145. Multiplexer 145 can be controlled, for example, by an externally-supplied input signal or a value stored in a memory cell (not shown). The amount of phase delay to be inserted is determined by multiplexer 144, which can also be controlled, for example, by externally-supplied input signals or values stored in memory cells (not shown). Multiplexers 146–147 are then controlled to determine whether a positive phase shift, a negative phase shift, or no phase shift is to be applied. Multiplexers 146–147 can also be controlled, for example, by externally-supplied input signals or by values stored in memory cells (not shown).

When no delay is added to either clock path (i.e., multiplexer 146 selects signal CLKIN to be provided as signal CLKIN2 and multiplexer 147 selects signal FBCLK to be provided as signal FBCLK2), no phase shift occurs. When delay is added to the FBCLK2 path (i.e., multiplexer 146 selects signal CLKIN, multiplexer 145 selects signal FBCLK, and multiplexer 147 selects the output signal from multiplexer 144), a negative phase shift occurs. In other words, signal FBCLK is shifted earlier compared to signal CLKIN. When delay is added to the CLKIN2 path (i.e., multiplexer 147 selects signal FBCLK, multiplexer 145 selects signal CLKIN, and multiplexer 146 selects the output signal from multiplexer 144), a positive phase shift occurs. In other words, signal FBCLK is shifted later compared to signal CLKIN.

A significant disadvantage of the circuit of FIG. 1 is that implementing DLLs typically requires a large amount of circuitry, as can be seen from FIG. 1. The circuit can be reduced in size by using PLLs rather than DLLS. However, PLLs are very process-dependent, as described in the background section above, and digital solutions are often preferred.

Figure 2:
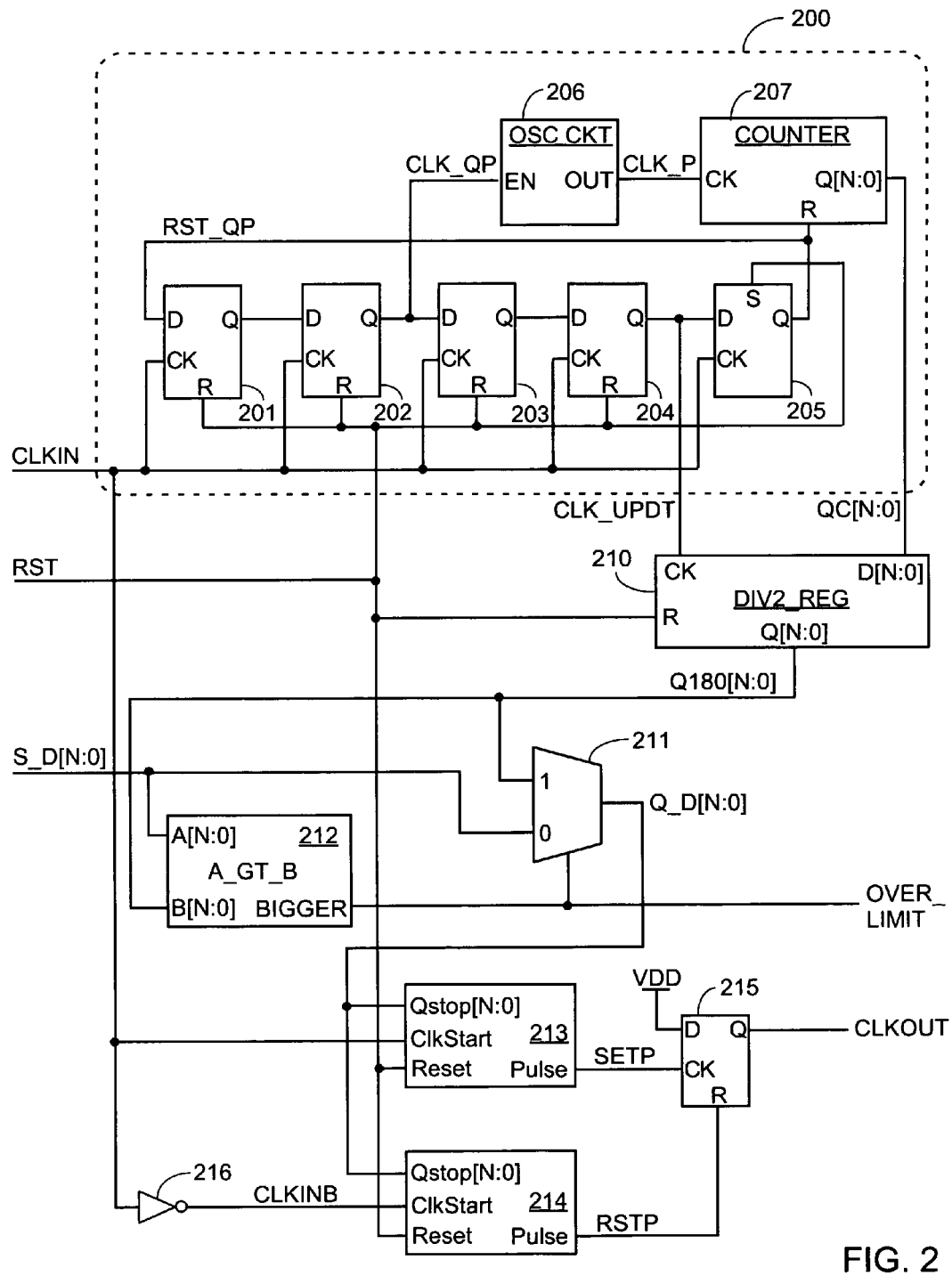
FIG. 2 illustrates a phase shifter circuit that allows a phase shift of up to one-half of an input clock period and does not provide duty cycle correction (DCC).

FIG. 2 illustrates a circuit requiring less circuitry than the circuit of FIG. 1, and also supporting a wider range of operating clock frequencies for the input clock signal. However, DCC is not provided in this embodiment. The circuit of FIG. 2 is small enough, for example, to be a practical addition to user circuits implemented in programmable logic devices (PLDs) such as field programmable gate arrays (FPGAs) and complex programmable logic devices (CPLDs). The circuit of FIG. 2 supports a phase shift of up to half of an input clock period.

Figure 3:
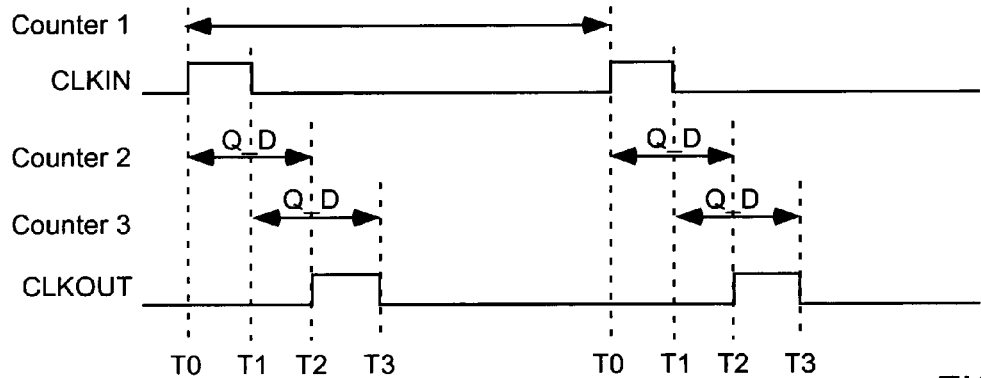
FIG. 3 is a timing diagram for the phase shifter circuit of FIG. 2.

FIG. 2 is a schematic diagram of a phase shifter circuit according to one embodiment of the invention that includes three counter circuits 200 and 213–214, a divide-by-two register 210, a maximum value circuit (comparator 212 and multiplexer 211), an inverter 216, and an output clock generator (flip-flop 215). The circuit of FIG. 2 operates as shown in FIG. 3. Thus, the combination of FIGS. 2 and 3 should be consulted in conjunction with the following explanation of the circuit of FIG. 2.

Counter circuit 1 (200) uses a relatively faster clock signal (e.g., generated by an oscillator circuit 206) to count a number of counts P (QC[N:0]) in one period of input clock signal CLKIN. The number of counts P is divided by two and stored in register 210. Thus, register 210 stores the value P/2, which represents the number of counts in one-half of the input clock period. The value P/2 is stored as signals Q180[N:0]. In the pictured embodiment, the number of counts P is recounted during every fifth input clock cycle. (N is an integer. In some embodiments, N is eight, but N can have also other values, as desired.)

To divide a multi-bit value by two, the least significant bit is dropped and the remaining bits are shifted one bit to the right, as is well known. Therefore, in some embodiments the number of bits stored in register 210 is one fewer than the number of bits in counter circuit 200. However, the number of bits is kept consistent through the drawings herein, for simplicity.

The maximum value circuit functions as follows to determine a delay value Q_D[N:0] that controls the magnitude of the phase shift. The maximum value circuit ensures that the delay value Q_D[N:0] does not exceed one-half of one input clock (CLKIN) period. Comparator 212 performs a comparison between a set delay S_D[N:0] and the maximum value (P/2, or Q180[N:0], in the pictured embodiment), and provides a high value on output signal BIGGER if the set delay exceeds the maximum value. Such comparators are well known in the relevant arts, and any appropriate implementation can be used. The set delay can be provided, for example, by an external bus, a value stored in on-chip memory, other circuitry included in the same integrated circuit, and so forth. Signal BIGGER controls multiplexer 211 to select the delay value Q_D[N:0]. If the maximum value is exceeded, the delay value Q_D[N:0] is set to the maximum value. Otherwise, the delay value Q_D[N:0] is set to the set delay S_D[N:0]. In the pictured embodiment, if the maximum value is exceeded the circuit also signals this condition by setting output signal OVER_LIMIT high.

The maximum value circuit shown in FIG. 2 is purely exemplary. In some embodiments, the maximum value circuit is omitted, and the delay value Q_D[N:0] is the output of register 210 (e.g., signals Q180[N:0]). In some embodiments, the maximum value circuit is implemented in some other fashion.

Note that divide-by-two register 210 serves to provide a maximum delay value of P/2 for the phase shifter circuit of FIG. 2. In some embodiments, the maximum delay has a value other than P/2. For example, if register 210 is replaced by a divide-by-four register, the maximum value is P/4. Other embodiments described herein illustrate examples of maximum values other than P/2 (see FIGS. 8–14).

Returning now to FIGS. 2 and 3, counter circuits 2 and 3 (213 and 214, respectively) are clocked by similar faster clock signals (e.g., generated by oscillator circuits having the same design and configuration as oscillator circuit 206). Counter circuit 2 (213) starts counting when input clock signal CLKIN (ClkStart) goes high, and compares the count value with the delay value Q_D[N:0] (Qstop[N:0]). When the value in counter circuit 2 reaches the delay value (at time T2 of FIG. 3), counter circuit 2 (213) provides a high output pulse on signal SETP. The high output pulse clocks a high value from power high VDD into the D terminal of flip-flop 215, driving signal CLKOUT high at time T2, as shown in FIG. 3. The high output pulse also resets counter circuit 2.

Counter circuit 3 (214) starts counting when input clock signal CLKIN goes low, because the clock start terminal (ClkStart) of counter circuit 3 is driven by signal CLKINB from inverter 216. Counter circuit 3 then compares the count value with the delay value Q_D[N:0] (Qstop[N:0]). When the value in counter circuit 3 reaches the delay value Q_D[N:0] (at time T3 of FIG. 3), counter circuit 3 (214) provides a high output pulse on signal RSTP. The high output pulse resets flip-flop 215, driving signal CLKOUT low at time T3, as shown in FIG. 3. The high output pulse also resets counter circuit 3.

Figure 2A:
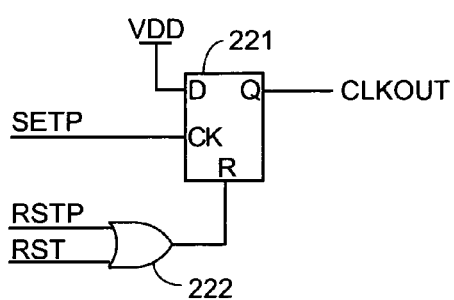
FIG. 2A illustrates a first output clock generator that can be used in the embodiment of FIG. 2.
Figure 2B:
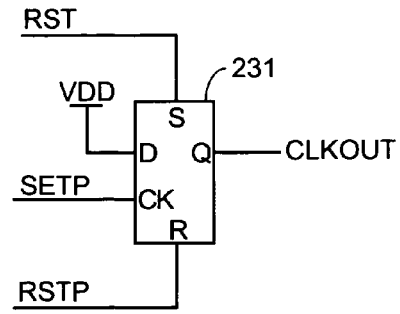
FIG. 2B illustrates a second output clock generator that can be used in the embodiment of FIG. 2.

FIGS. 2A and 2B illustrate exemplary alternative implementations of the output clock generator of FIG. 2. Other implementations can also be used, as will be apparent to those of skill in the relevant arts. The circuit of FIG. 2A includes a reset flip-flop 221 and a logical OR gate 222 (which can be implemented, for example, as a NOR gate followed by an inverter). The data input D of flip-flop 221 is coupled to power high VDD, the clock input CK is coupled to receive signal SETP, and the output terminal Q is coupled to output clock terminal CLKOUT, as in FIG. 2. However, the reset terminal of flip-flop 221 is coupled to the output terminal of logical OR gate 222, which is driven by signals RSTP and RST. Thus, when the phase detector circuit of FIG. 2 is reset by a high value on signal RST, output clock signal CLKOUT is driven low.

The circuit of FIG. 2B includes a set/reset flip-flop 231. The data input D of flip-flop 231 is coupled to power high VDD, the clock input CK is coupled to receive signal SETP, the reset terminal R is coupled to receive signal RSTP, and the output terminal Q is coupled to output clock terminal CLKOUT, as in FIG. 2. However, flip-flop 231 also has a set terminal coupled to receive circuit reset signal RST. Thus, when the phase detector circuit of FIG. 2 is reset by a high value on signal RST, output clock signal CLKOUT is driven high.

In the pictured embodiment, counter circuit 1 (200) is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of counter circuit 200 are used. Any appropriate embodiment can be used.

Counter circuit 200 has as inputs input clock signal CLKIN and reset signal RST. Counter circuit 200 provides a clock update signal CLK_UPDT and a counter output bus QC[N:0] representing the value P. In the pictured embodiment, counter circuit 200 includes a counter 207, which counts a number of counts in one period of the input clock signal CLKIN.

In the pictured embodiment, counter circuit 200 includes reset flip-flops 201–204, set flip-flop 205, oscillator circuit 206, and counter 207. Flip-flops 201–205 are coupled in series, and serve to provide three non-overlapping clock pulses in the following repeating sequence: RST_QP, CLK_QP, and CLK_UPDT. Each of these signals is high for only one clock cycle.

Initially, signal RST_QP is high, because flip-flop 205 is a set flip-flop, and counter 207 is reset. The first rising edge of signal CLKIN brings signal RST_QP low. On the second rising edge of signal CLKIN, signal CLK_QP provides a high value on oscillator enable signal EN to oscillator circuit 206. Thus, oscillator enable signal EN is high for one out of every five input clock cycles. Oscillator circuit 206 generates a relatively fast oscillator output signal OUT (i.e., faster than input clock signal CLKIN) whenever signal EN is high.

The oscillator output signal CLK_P is used by counter 207 to measure the input clock period. Thus, in the pictured embodiment counter 207 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 207. The cycle then repeats each five clock cycles.

Note that the number of flip-flops coupled in series in counter circuit 200 determines the frequency with which the length of the input clock period is determined. For example, in the embodiment of FIG. 2, the period is measured every five clock cycles. By adding another reset flip-flop to the chain (e.g., in front of set flip-flop 205), the period would be measured every six clock cycles, and so forth. It will be clear to one of skill in the relevant arts that this selection is a matter of design choice.

Figure 4:
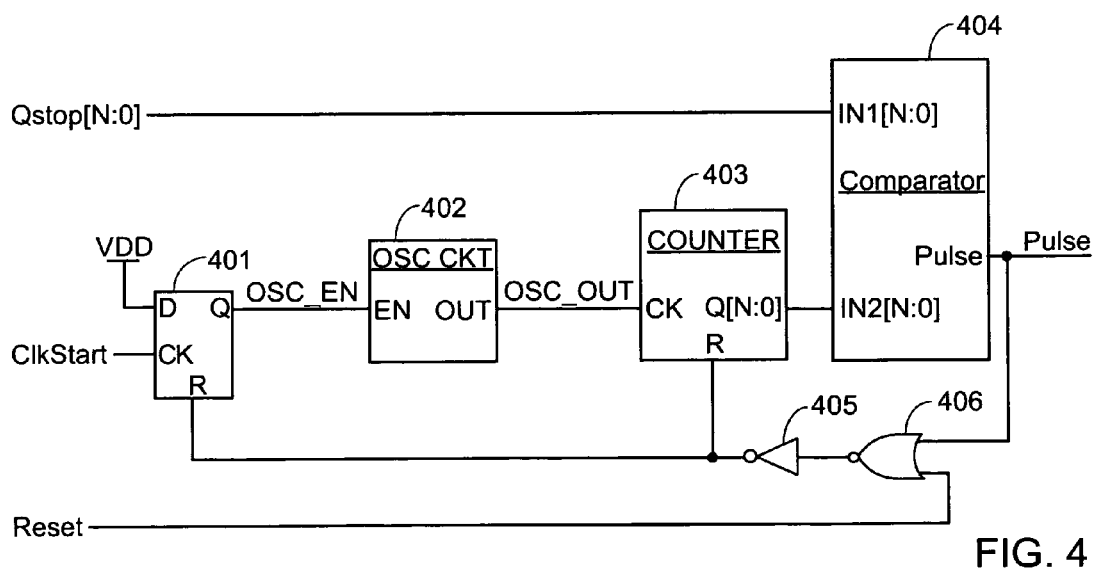
FIG. 4 is a schematic diagram of a counter circuit that can optionally be used to implement the second and third counter circuits in the embodiment of FIG. 2.

FIG. 4 is a schematic diagram of one counter embodiment that can be used to implement counter circuit 213–214 of FIG. 2. This embodiment can be used, for example, when counter 200 is implemented as shown in FIG. 2. The counter circuit of FIG. 4 includes a reset flip-flop 401, an oscillator circuit 402, a counter 403, a comparator 404, a NOR gate 406, and an inverter 405. When signal ClkStart goes high, the power high VDD value is clocked into flip-flop 401, driving flip-flop output signal OSC_EN high and enabling oscillator 402. Oscillator 402 provides an output signal OSC_OUT having a frequency relatively much higher than that of input clock signal CLKIN. Counter 403 is clocked by oscillator 402, and thus counts the oscillations on signal OSC_OUT. The value stored in counter 403 is passed to comparator 404, where it is compared to the value Qstop[N:0]. When the values match, signal Pulse goes high, resetting flip-flop 401 and counter 403 via NOR gate 406 and inverter 405. Signal Reset can also reset flip-flop 401 and counter 403 via NOR gate 406 and inverter 405.

Any known oscillator circuit can be used to implement oscillator circuit 402 of FIG. 4 and oscillator circuit 206 of FIG. 2. Preferably, the same implementation is used for all three oscillator circuits in the phase shifter circuit, as this approach creates a high correlation among the three oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the phase shifter circuit is implemented in a PLD, because the oscillator can be implemented using the programmable logic blocks of the PLD. In some embodiments, external oscillators are used.

Any known counter or counters can be used to implement counter 403 of FIG. 4 and/or counter 207 of FIG. 2. For example, the well known ripple counters can be used. In some embodiments, double-edge flip-flops are used to double the count stored in the counter. In some embodiments, a first subset of the counter circuits use double-edge flip-flops with a first oscillator frequency, while a second subset of the counter circuits use single-edge flip-flops with a second oscillator frequency twice that of the first oscillator frequency.

Any known comparator can be used to implement comparator 404 of FIG. 4. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signal in FIG. 4.

Figure 5:
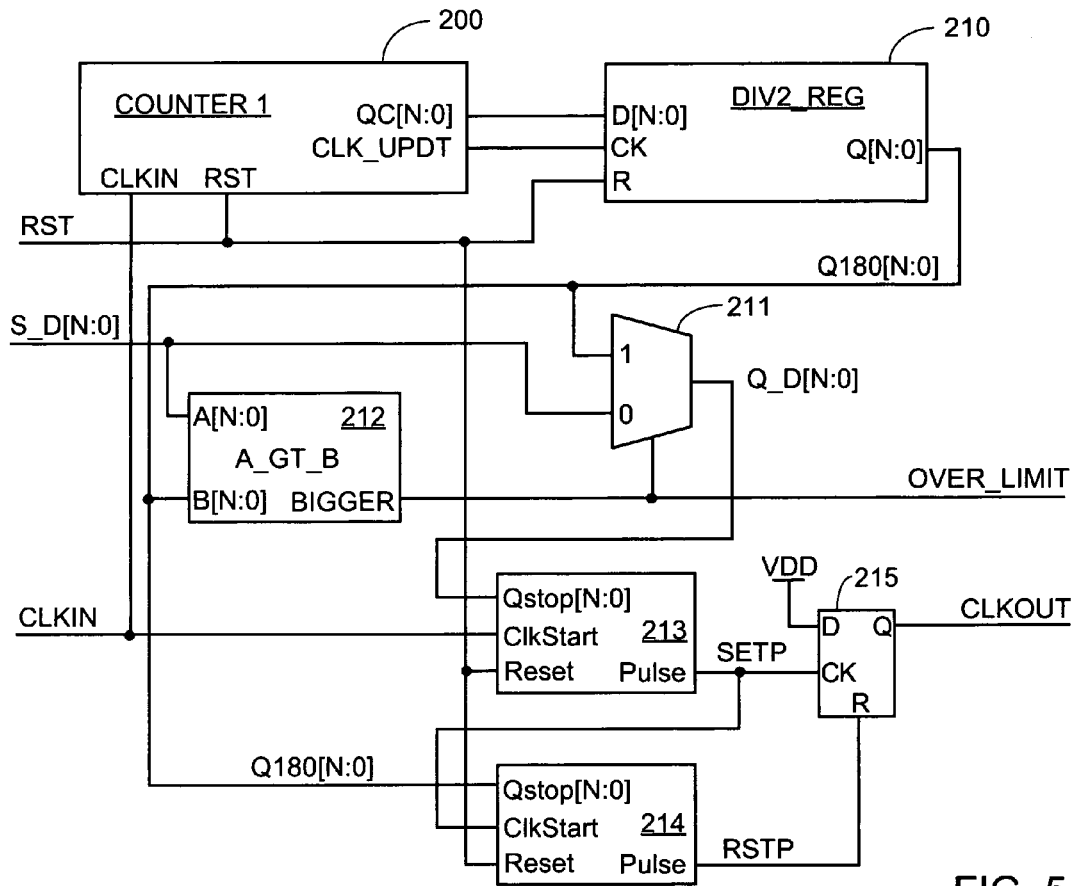
FIG. 5 illustrates a phase shifter circuit that allows a phase shift of up to one-half of an input clock period and provides 50 percent DCC.
Figure 6:
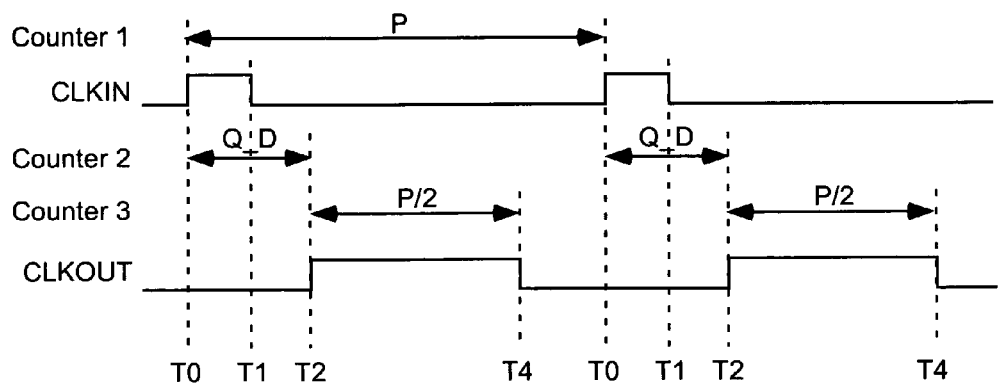
FIG. 6 is a timing diagram for the phase shifter circuit of FIG. 5.

FIG. 5 is a schematic diagram of a phase shifter circuit according to another embodiment of the invention that provides 50 percent DCC. The embodiment of FIG. 5 is similar to that of FIG. 2, but counter circuit 3 (214) has different clock start and clock stop values, altering the position of the falling edge on the output clock signal CLKOUT. Note that the elements of FIG. 5 are similar to those of FIG. 2, and are similarly interconnected, except as is now described. FIG. 6 is a timing diagram for the phase shifter circuit of FIG. 5.

As in the embodiment of FIG. 2, counter circuit 1 (200) uses a relatively faster clock signal (e.g., generated by oscillator circuit 206) to count a number of counts P in one period of input clock signal CLKIN. The number of counts P is divided by two and stored in register 210 as signals Q180[N:0]. The number of counts P is recounted every fifth clock cycle. Counter circuits 2 and 3 (213 and 214) are clocked by similar faster clock signals (e.g., generated by oscillator circuits having the same design and configuration as oscillator circuit 206). Counter circuit 2 (213) functions in the same fashion as in the embodiment of FIG. 2, driving output clock signal CLKOUT high at time T2.

Counter circuit 3 (214) starts counting when signal SETP goes high at time T2. Counter circuit 3 then compares the count value with the P/2 value Q180[N:0] (Qstop[N:0]). When the value in counter circuit 3 reaches the P/2 value Q180[N:0] (at time T4 of FIG. 6), counter circuit 3 (214) provides a high output pulse on signal RSTP. The high output pulse resets flip-flop 215, driving signal CLKOUT low at time T4, as shown in FIG. 6. The high output pulse also resets counter circuit 3. Note that the high pulse on the output clock signal CLKOUT has a duration of one-half of the input clock period, i.e., the output clock signal CLKOUT has a 50 percent duty cycle.

Figure 7:
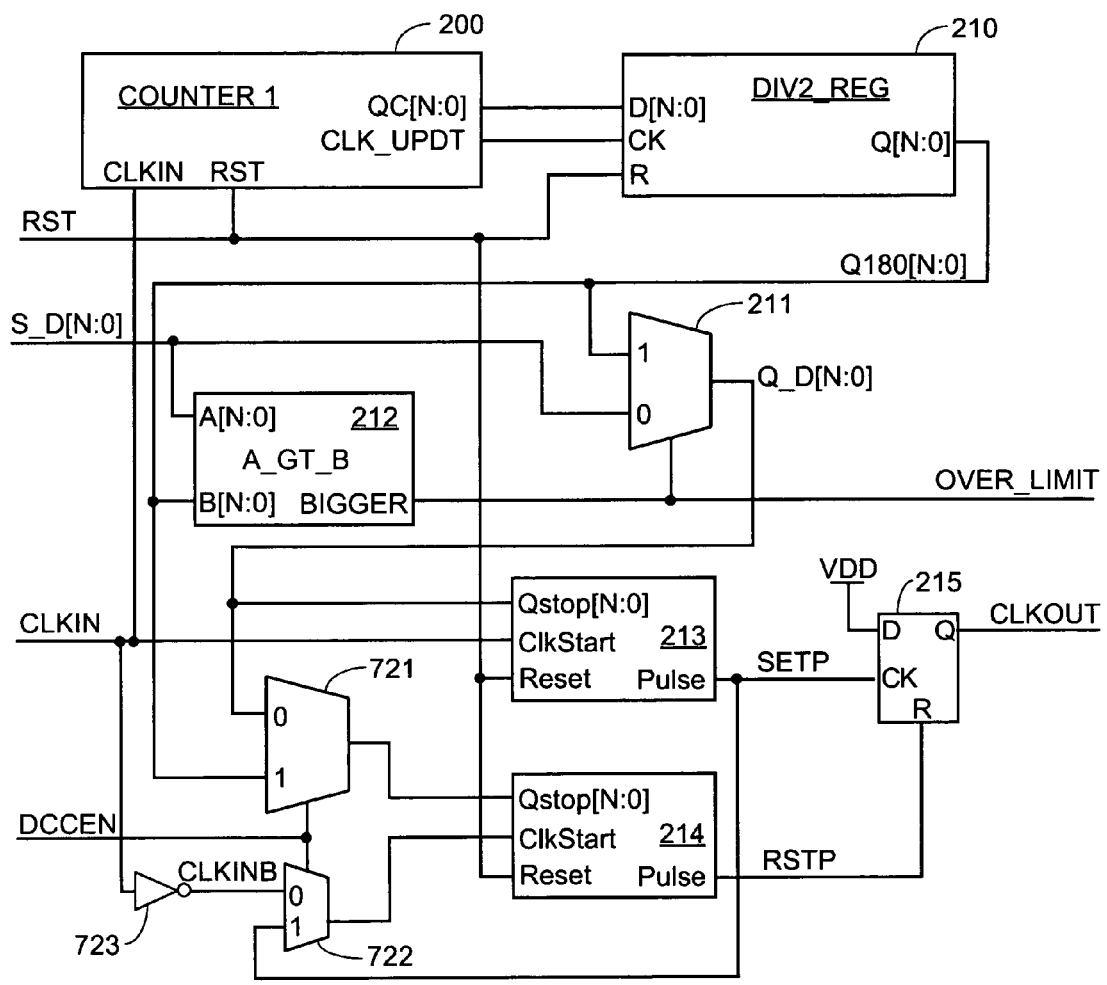
FIG. 7 illustrates a phase shifter circuit that allows a phase shift of up to one-half of an input clock period and optionally provides or does not provide 50 percent DCC.

The embodiment of FIG. 7 optionally provides or does not provide DCC, as controlled by a DCC enable signal DCCEN. The embodiment of FIG. 7 is similar to those of FIGS. 2 and 5, but provides a selection of input values for counter circuit 3 (214), thereby providing control over the position of the falling edge on the output clock signal CLKOUT. Only the differences from the earlier figures are described.

When DCC is enabled (DCCEN is high), multiplexer 722 selects signal SETP to provide to the clock start terminal (ClkStart) of counter circuit 3 (214), and multiplexer 721 selects the P/2 value Q180[N:0] to provide to the clock stop terminal (Qstop[N:0]) of counter circuit 3 (214). Thus, the circuit of FIG. 7 behaves like the circuit of FIG. 5, and output clock signal CLKOUT has a 50 percent duty cycle.

When DCC is disabled (DCCEN is low), multiplexer 722 selects signal CLKINB (provided by inverter 723) to provide to the clock start terminal (ClkStart) of counter circuit 3 (214), and multiplexer 721 selects the delay value Q_D[N:0] to provide to the clock stop terminal (Qstop[N:0]) of counter circuit 3 (214). Thus, the circuit of FIG. 7 behaves like the circuit of FIG. 2, and output clock signal CLKOUT has the same duty cycle as input clock signal CLKIN.

Figure 8:
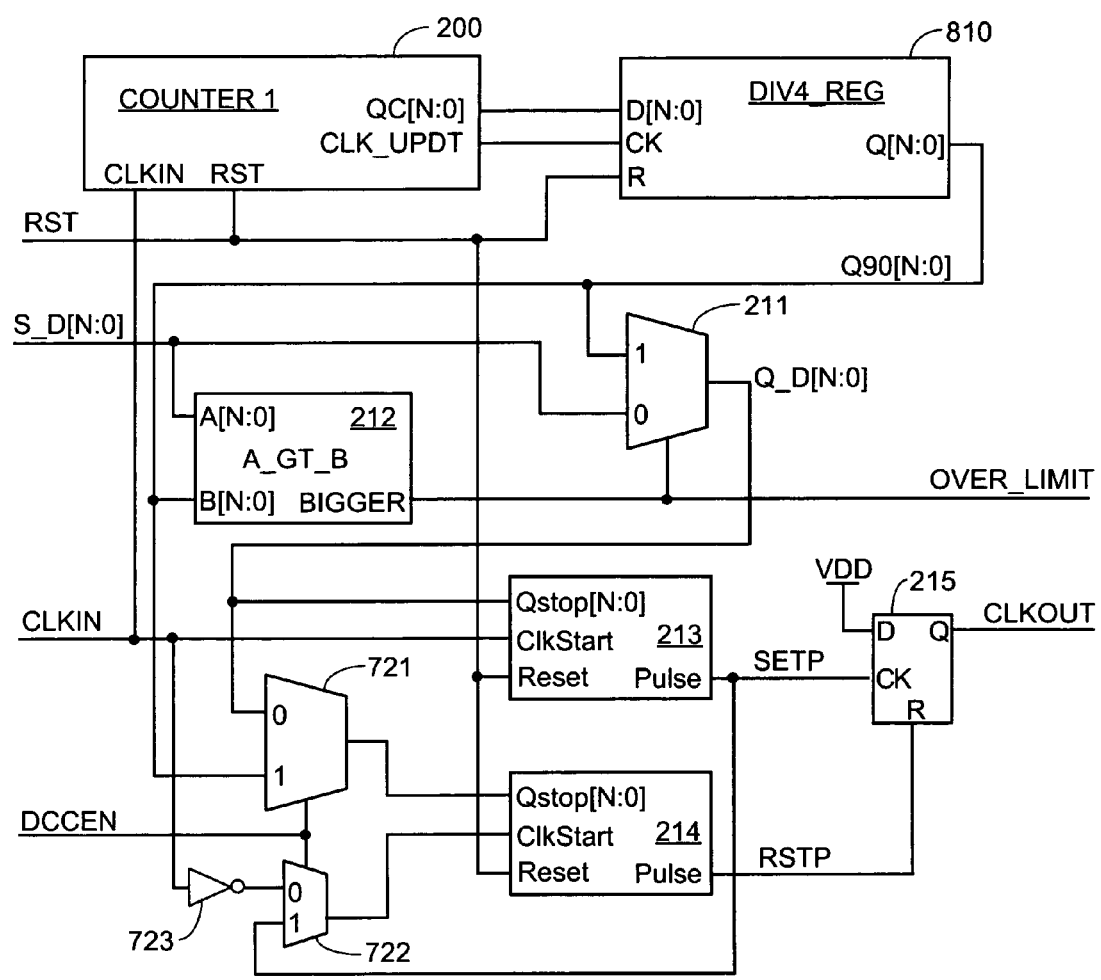
FIG. 8 illustrates a phase shifter circuit that allows a phase shift of up to one-fourth of an input clock period and optionally provides or does not provide 25 percent DCC.

As previously described, in the embodiment of FIG. 2 divide-by-two register 210 serves to provide a maximum delay value of P/2 for the illustrated phase shifter circuit. In the embodiment of FIGS. 5 and 7, divide-by-two register 210 provides a maximum delay value of P/2, and also serves to provide a DCC value of P/2 for the output clock signal (i.e., the output clock signal has a 50 percent duty cycle). FIG. 8 illustrates a variation of the circuit of FIG. 7 in which the maximum value and the DCC value are both P/4. When the DCC value is P/4, the output clock signal has a 25 percent duty cycle.

FIG. 8 is similar to FIG. 7, except that divide-by-two register 210 is replaced by divide-by-four register 810. Register 810 divides the count value QC[N:0] by four, e.g., by dropping the two least significant bits and shifting the remaining bits two bits to the right. Therefore, in some embodiments the number of bits stored in register 810 is two fewer than the number of bits in counter circuit 200.

The output signals Q90[N:0] stored in divide-by-four register 810 represent P/4. Signals Q90[N:0] are used by the maximum value circuit to determine the delay value Q_D [N:0], and by multiplexer 721 as the clock stop value for counter circuit 3 (214) when DCC is enabled. Thus, signals Q90[N:0] represent both the maximum value and the DCC value.

If a similar variation is applied to the circuit of FIG. 2 (i.e., replacing divide-by-two register 210 by a divide-by-four register), the resulting circuit does not provide DCC and has a maximum delay value of P/4. If a similar variation is applied to the circuit of FIG. 5, the resulting circuit always provides DCC and has both a maximum value and a DCC value of P/4.

Figure 9:
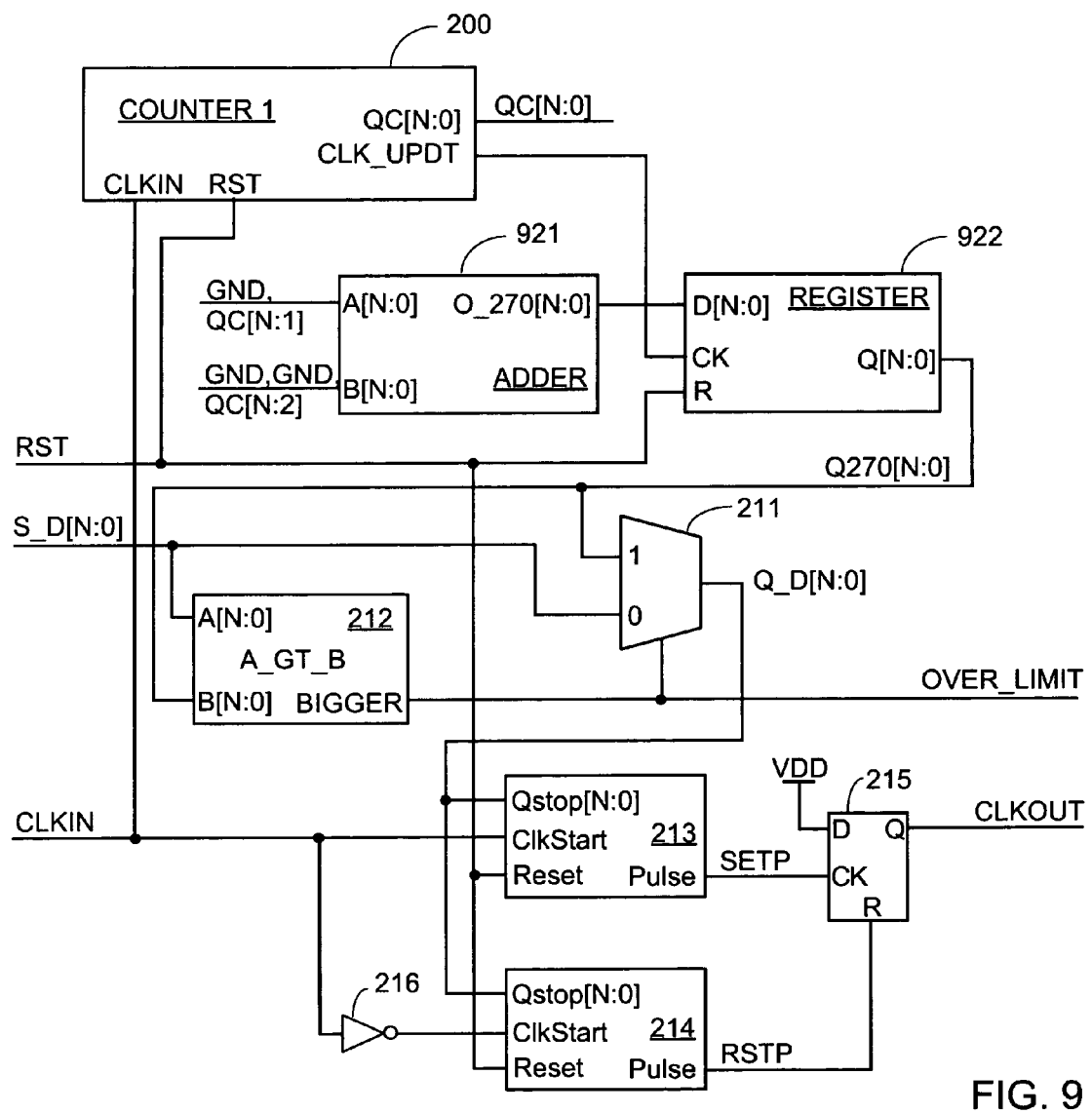
FIG. 9 illustrates a phase shifter circuit that allows a phase shift of up to three-fourths of an input clock period and does not provide DCC.

FIG. 9 is similar to FIG. 2, except that divide-by-two register 210 of FIG. 2 is replaced by adder 921 and register 922. Adder 921 adds together two values, P/2 (GND, QC[N: 1]) and P/4 (GND, GND, QC[N:2]). Any appropriate adder design can be used to implement adder 921, e.g., a ripple adder or a bypass adder. The resulting sum O_270[N:0] is stored in register 922. The stored value Q270[N:0] represents the number of counts in three-fourths of one input clock cycle. Thus, signals Q270[N:0] represent a maximum delay value of 3P/4 for the circuit of FIG. 9.

Figure 10:
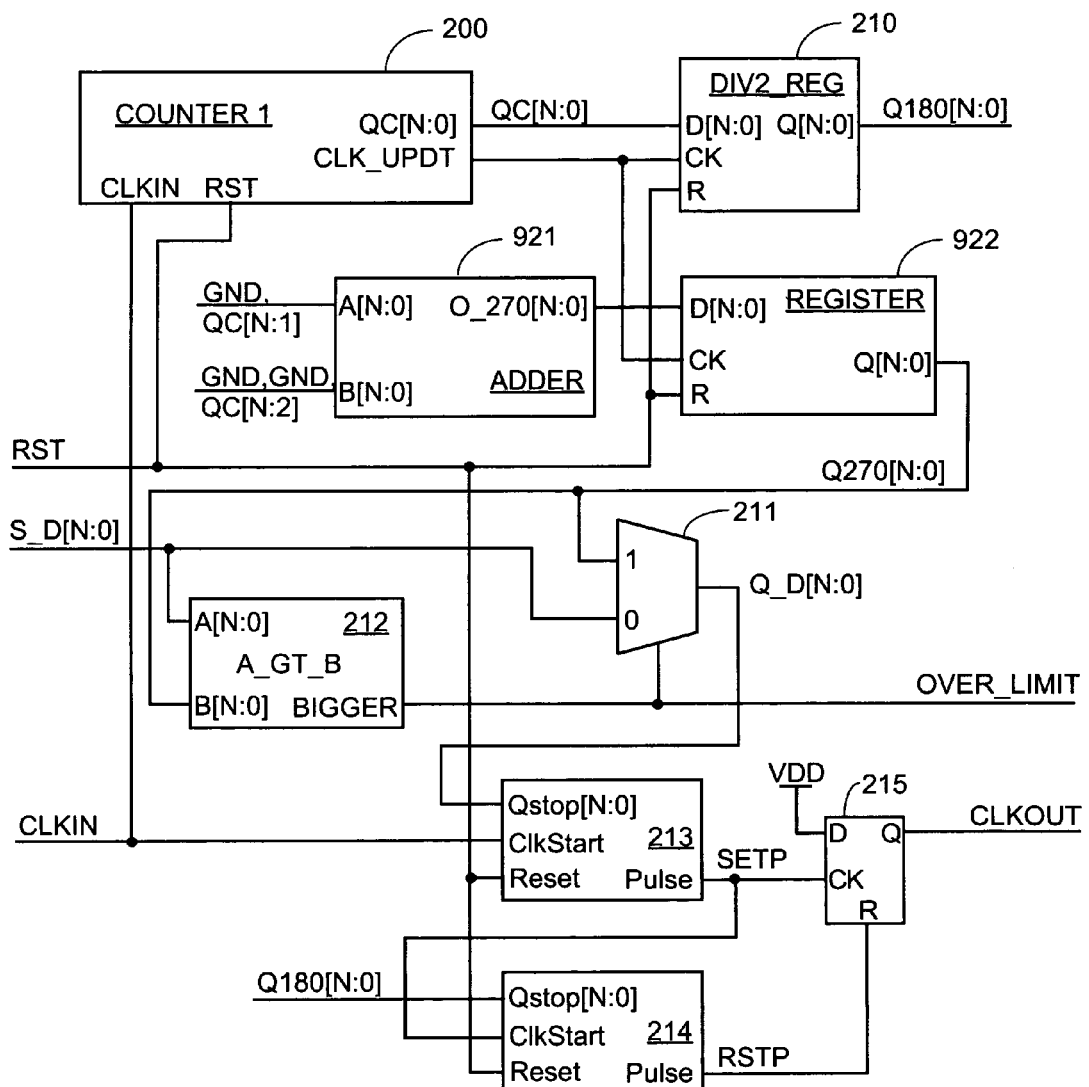
FIG. 10 illustrates a phase shifter circuit that allows a phase shift of up to three-fourths of an input clock period and provides 50 percent DCC.

FIG. 10 is similar to FIG. 5, except that in addition to divide-by-two register 210, an adder 921 and register 922 are included. Adder 921 adds together two values, P/2 (GND, QC[N:1]) and P/4 (GND, GND, QC[N:2]). The resulting sum O_270[N:0] is stored in register 922. The stored value Q270[N:0] represents the number of counts in three-fourths of one input clock cycle. Thus, signals Q270 [N:0] represent a maximum delay value of 3P/4 for the circuit of FIG. 10. The circuit of FIG. 10, like the circuit of FIG. 5, provides an output signal CLKOUT with a 50 percent duty cycle. The DCC value of Q180[N:0] (P/2) is provided by register 210.

Figure 11:
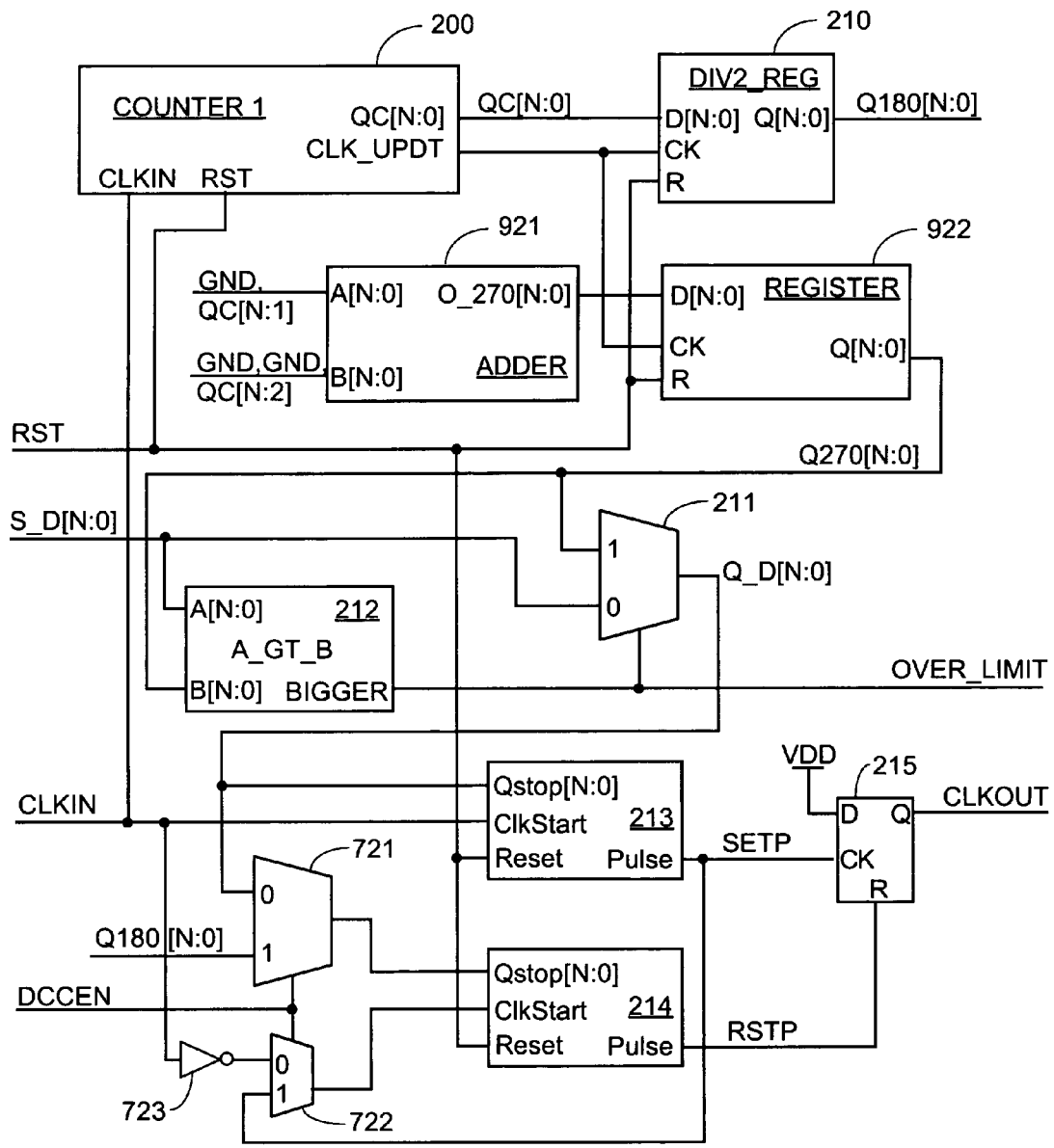
FIG. 11 illustrates a phase shifter circuit that allows a phase shift of up to three-fourths of an input clock period and optionally provides or does not provide 50 percent DCC.

FIG. 11 is similar to FIG. 7, except that in addition to divide-by-two register 210, an adder 921 and register 922 are included. Adder 921 adds together two values, P/2 (GND, QC[N:1]) and P/4 (GND, GND, QC[N:2]). The resulting sum O_270[N:0] is stored in register 922. The stored value Q270[N:0] represents the number of counts in three-fourths of one input clock cycle. Thus, signals Q270 [N:0] represent a maximum delay value of 3P/4 for the circuit of FIG. 11. The circuit of FIG. 11, like the circuit of FIG. 7, optionally provides or does not provide 50 percent DCC for the output clock signal CLKOUT. The optional DCC value of Q180[N:0] (P/2) is provided by register 210.

Figure 12:
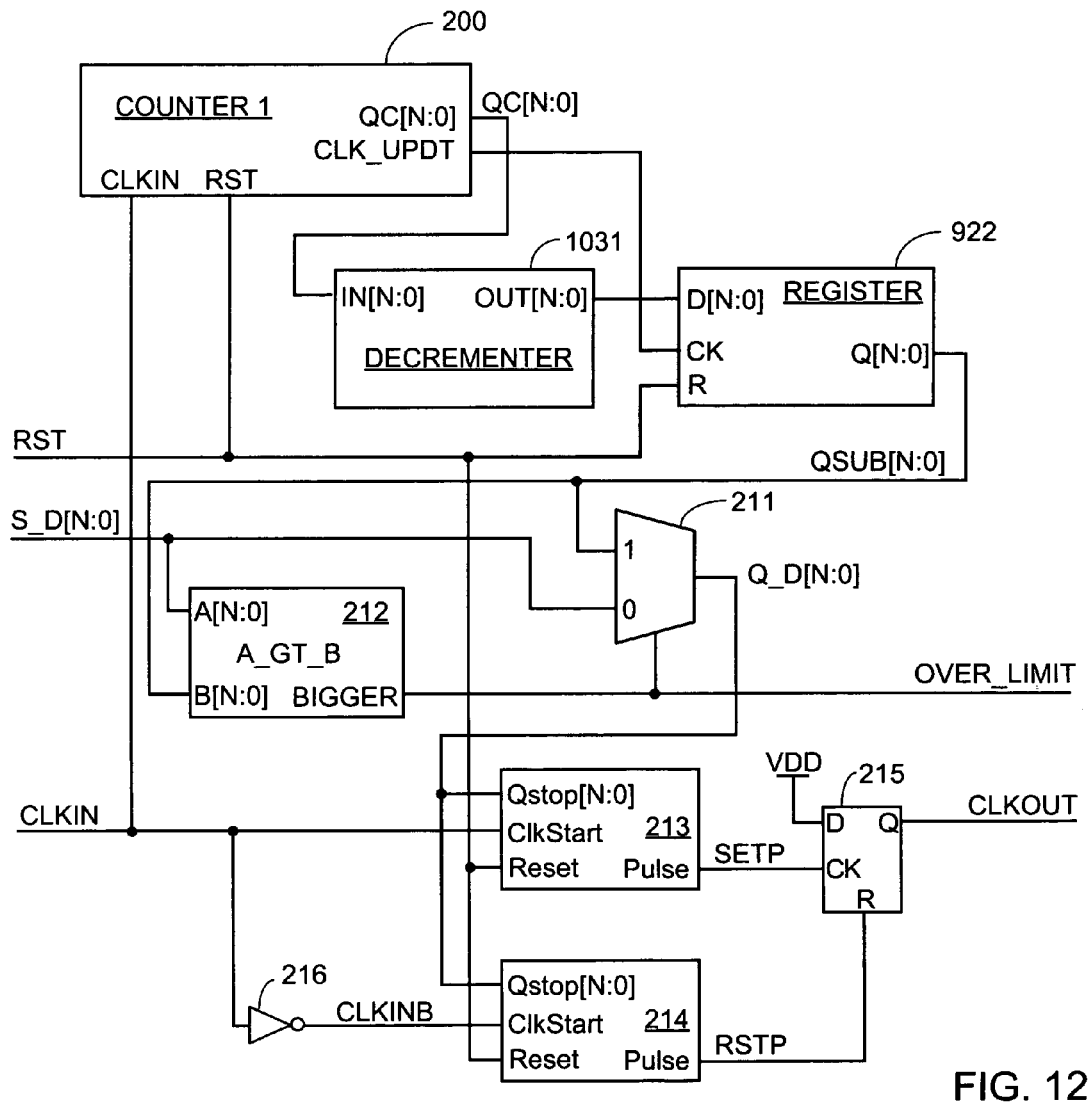
FIG. 12 illustrates a phase shifter circuit that allows a phase shift of up one input clock period minus a predetermined decrement value, and does not provide DCC.

FIG. 12 is similar to FIG. 2, except that divide-by-two register 210 is replaced by a decrementer 1031 and register 922. Decrementer 1031 subtracts a predetermined value (e.g., one or two) from the input signals QC[N:0]. Any appropriate decrementer design can be used to implement decrementer 1031, e.g., a ripple subtractor with one set of inputs tied to 0 . . . 01. The resulting value OUT[N:0] is stored in register 922. The stored value QSUB[N:0] represents the number of counts in one input clock cycle minus the predetermined subtracted value. Thus, signals QSUB[N: 0] represent a maximum delay value of P−s, where s is the predetermined subtracted value.

The embodiment of FIG. 12 can be useful, for example, when the largest possible phase delay is desired. If the set delay is actually equal to P, the circuit might not function properly. Therefore, "backing off" the maximum delay by one or two counts (or by some other number of counts) from the value P can ensure that the circuit functions properly, while allowing the largest reliable value for the phase delay.

Figure 13:
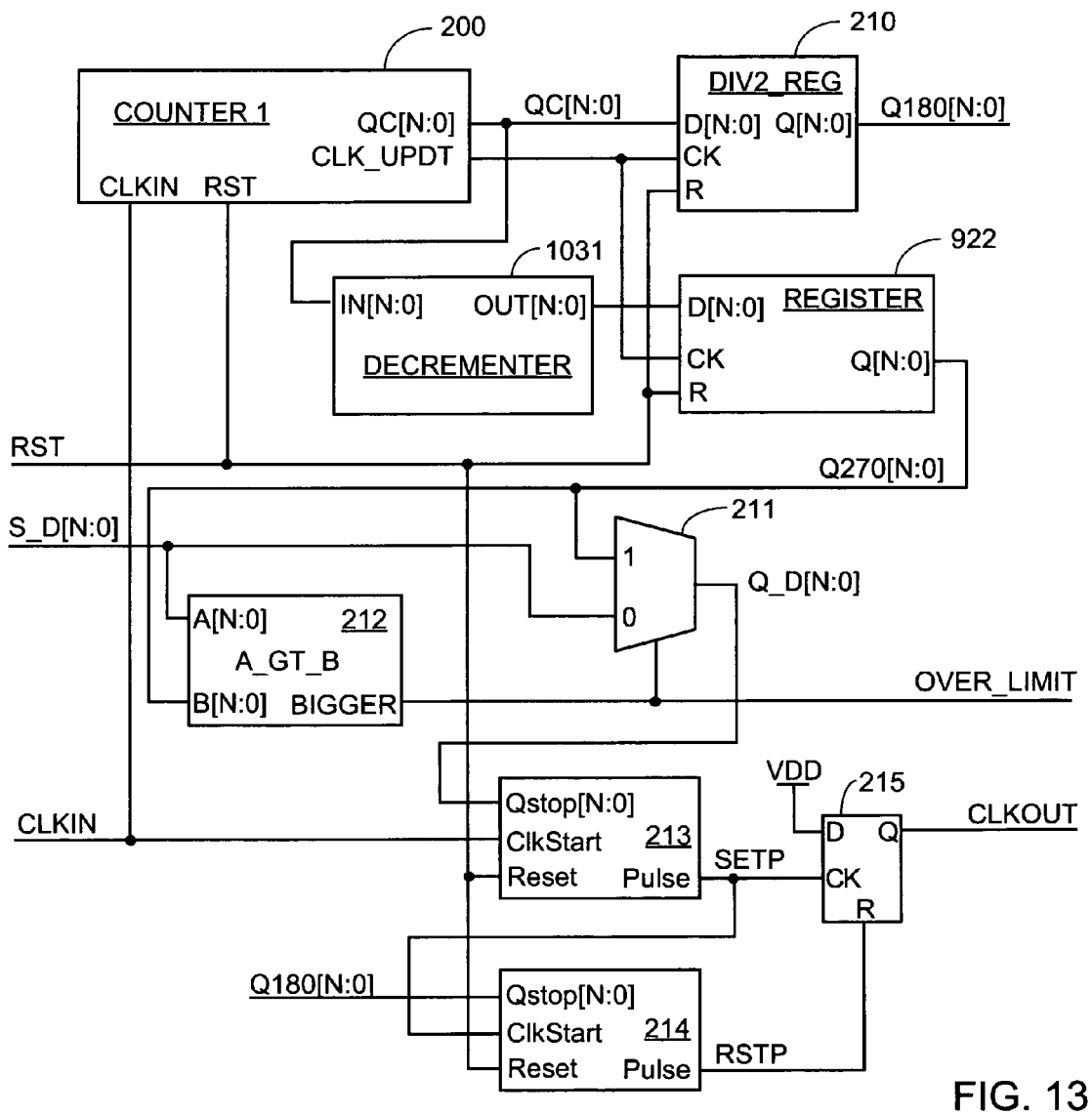
FIG. 13 illustrates a phase shifter circuit that allows a phase shift of up one input clock period minus a predetermined decrement value, and provides 50 percent DCC.

FIG. 13 is similar to FIG. 5, except that in addition to divide-by-two register 210, a decrementer 1031 and register 922 are included. Decrementer 1031 subtracts a predetermined value (e.g., one or two) from the input signals QC[N:0]. The resulting value OUT[N:0] is stored in register 922. The stored value QSUB[N:0] represents the number of counts in one input clock cycle minus the predetermined subtracted value. Thus, signals QSUB[N:0] represent a maximum delay value of P−s, where s is the predetermined subtracted value. The circuit of FIG. 13, like the circuit of FIG. 5, provides an output signal CLKOUT with a 50 percent duty cycle. The DCC value of Q180[N:0] (P/2) is provided by register 210.

Figure 14:
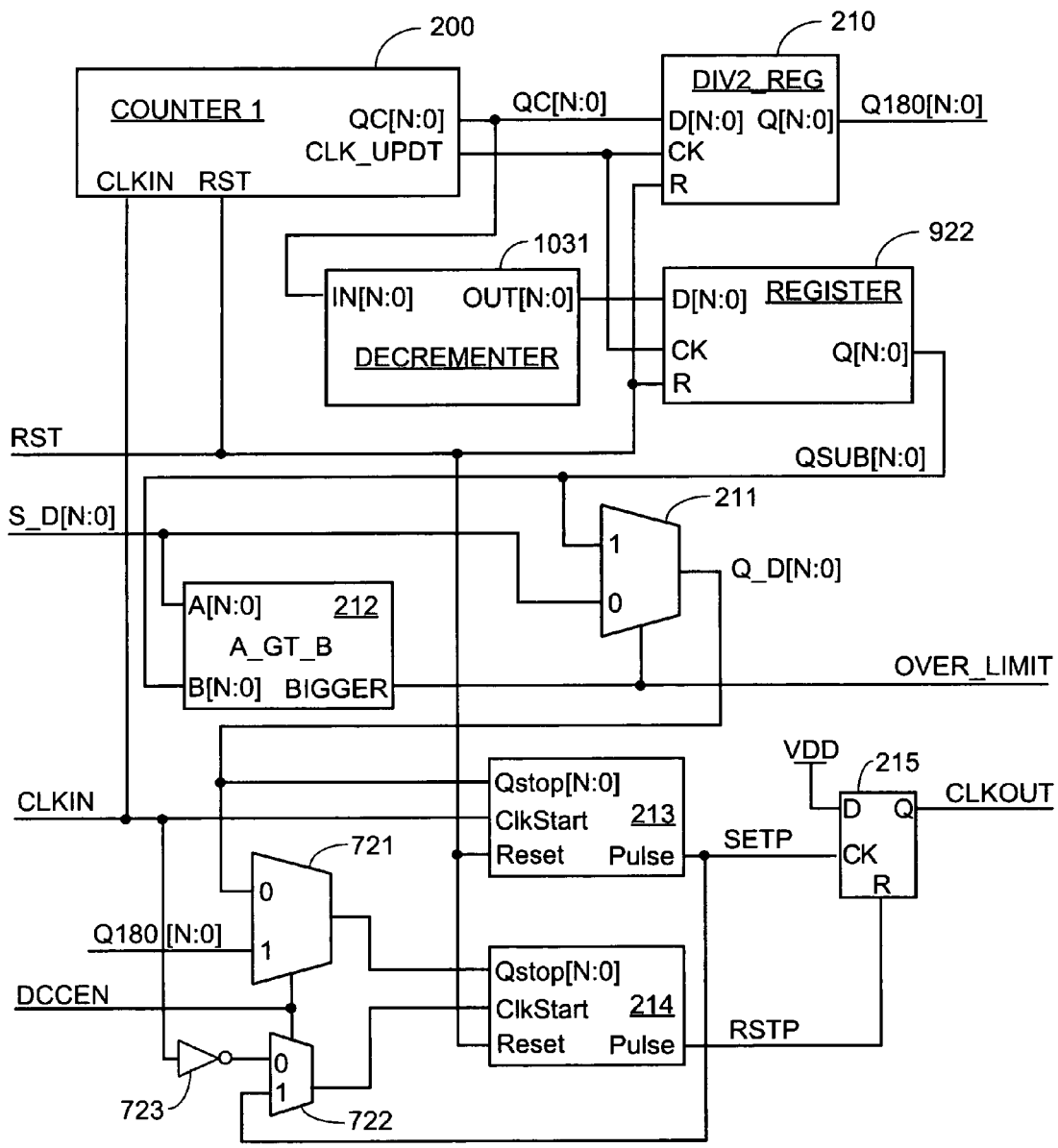
FIG. 14 illustrates a phase shifter circuit that allows a phase shift of up one input clock period minus a predetermined decrement value, and optionally provides or does not provide 50 percent DCC.

FIG. 14 is similar to FIG. 7, except that in addition to divide-by-two register 210, a decrementer 1031 and register 922 are included. Decrementer 1031 subtracts a predetermined value (e.g., one or two) from the input signals QC[N:0]. The resulting value OUT[N:0] is stored in register 922. The stored value QSUB[N:0] represents the number of counts in one input clock cycle minus the predetermined subtracted value. Thus, signals QSUB[N:0] represent a maximum delay value of P−s, where s is the predetermined subtracted value. The circuit of FIG. 14, like the circuit of FIG. 7, optionally provides or does not provide 50 percent DCC for the output clock signal CLKOUT. The optional DCC value of Q180[N:0] (P/2) is provided by register 210.

Figure 15:
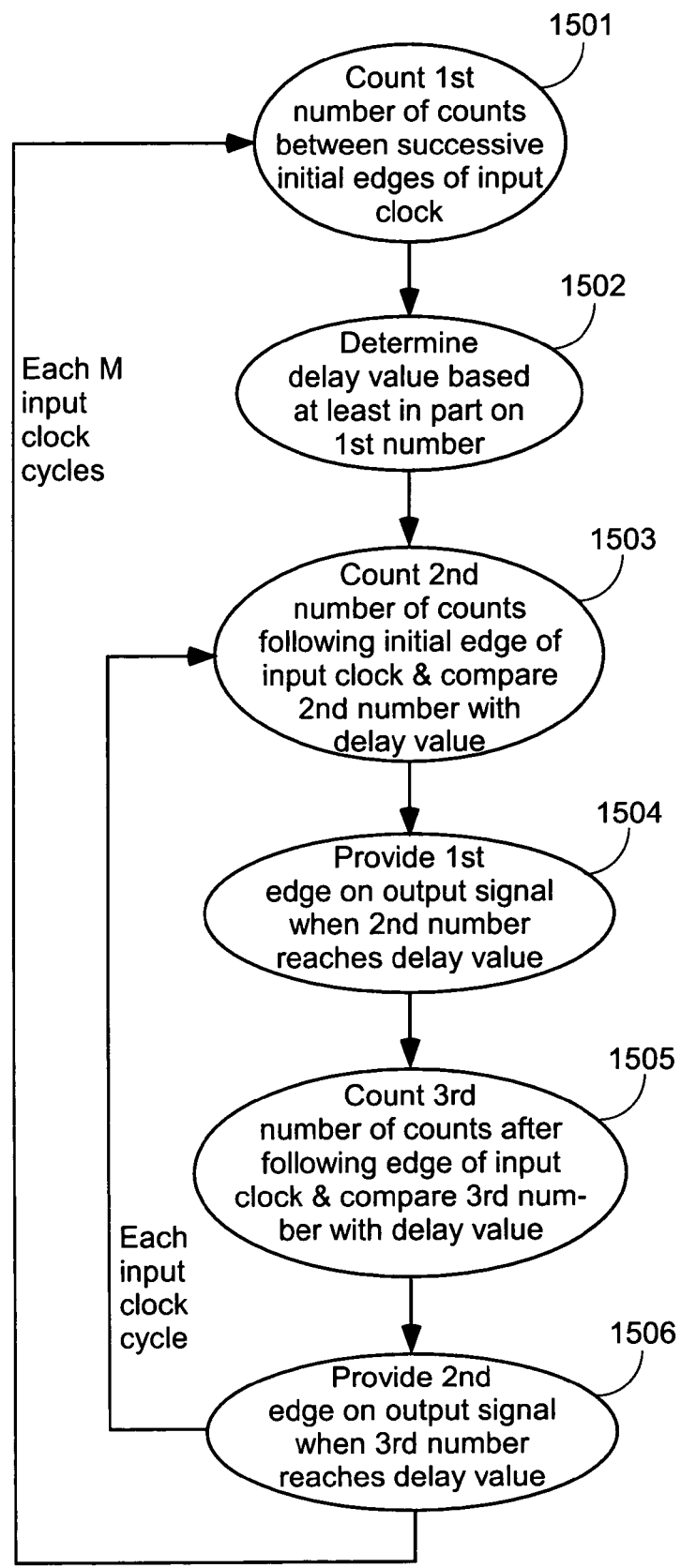
FIG. 15 illustrates the steps of a first method of providing a phased output clock signal from an input clock signal, according to an embodiment of the present invention.

FIG. 15 illustrates the steps of a first novel method of providing a phased output clock signal from an input clock signal, according to another embodiment of the invention. In some embodiments, the steps of FIG. 15 are performed by a circuit implemented in a programmable logic device (PLD), for example in a field programmable gate array (FPGA) or a complex programmable logic device (CPLD).

In step 1501, a first number of counts between successive initial edges of an input clock signal is counted. For example, in the embodiment of FIG. 2, counter 1 (200) counts a number P of oscillator clock cycles within a single period of input clock signal CLKIN. In some embodiments, the initial edges are rising edges.

In step 1502, a delay value is determined, based at least in part on the first number. The delay value can be, for example, a set delay provided by a PLD user. In some embodiments, the set delay value is compared with a maximum value. If the set delay does not exceed the maximum value, the set delay value is selected as the delay value. If the set delay exceeds the maximum value, the maximum value is selected as the delay value.

In some embodiments, the maximum value is determined by dividing the first number by two, by four, or by another number. In some embodiments, the maximum value is determined by adding together one-half of the first number and one-quarter of the first number. In some embodiments, the maximum value is determined by subtracting a predetermined value from the first number.

In step 1503, a second number of counts is counted following each initial edge of the input clock signal, and the second number is compared with the delay value.

In step 1504, a first edge is provided on an output clock signal when the second number reaches the delay value. In some embodiments, the first edges are rising edges.

In step 1505, a third number of counts is counted following each following edge of the input clock signal, and the third number is compared with the delay value. In some embodiments (i.e., where the initial edges are rising edges), the following edges are falling edges.

In step 1506, a second edge is provided on the output clock signal when the third number reaches the delay value. In some embodiments (i.e., where the first edges are rising edges), the second edges are falling edges.

In some embodiments, counting the first number of counts is repeated every M periods of the input clock signal, where M is an integer. In some embodiments, M is five.

Figure 16:
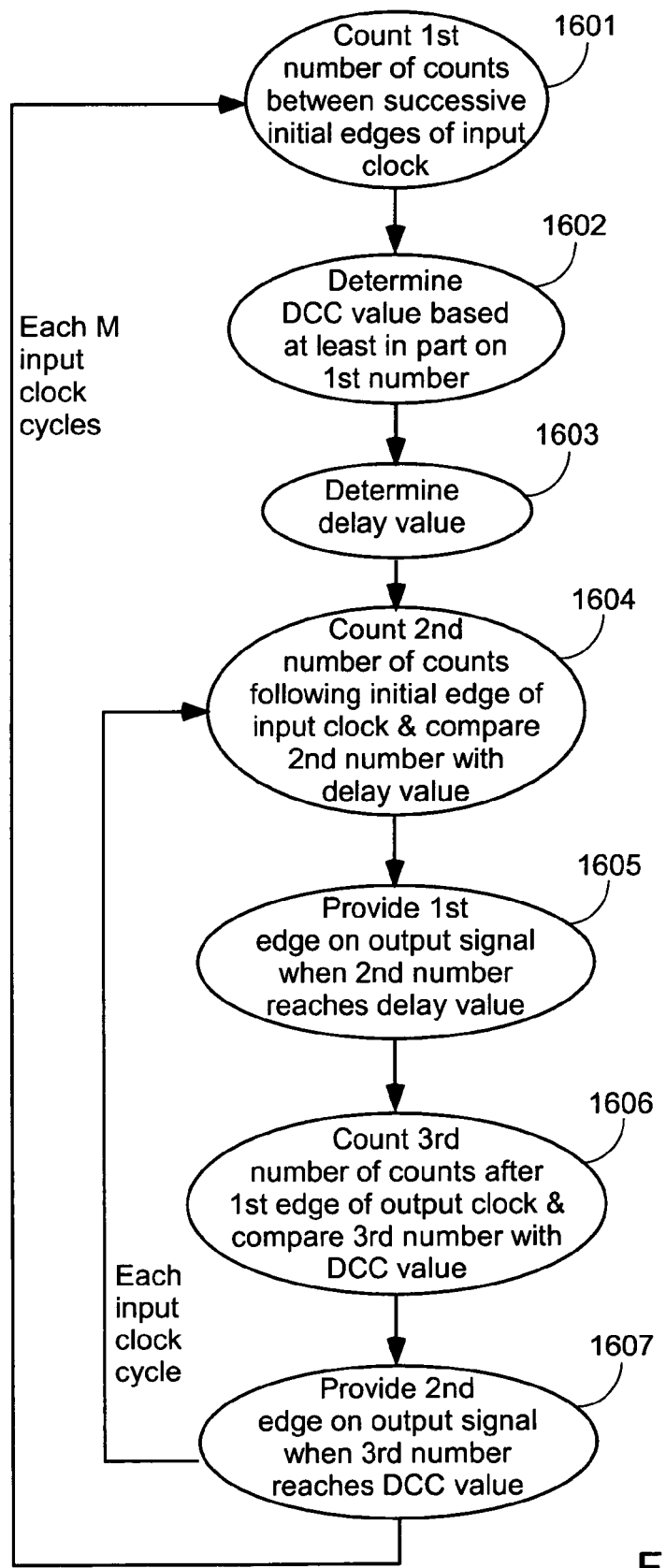
FIG. 16 illustrates the steps of a second method of providing a phased output clock signal from an input clock signal, according to another embodiment of the present invention.

FIG. 16 illustrates the steps of a second novel method of providing a phased output clock signal from an input clock signal, according to another embodiment of the invention. In some embodiments, the steps of FIG. 16 are performed by a circuit implemented in a programmable logic device (PLD), for example in a field programmable gate array (FPGA) or a complex programmable logic device (CPLD).

In step 1601, a first number of counts between successive initial edges of an input clock signal is counted. For example, in the embodiment of FIG. 5, counter 1 (200) counts a number P of oscillator clock cycles within a single period of input clock signal CLKIN. In some embodiments, the initial edges are rising edges.

In step 1602, a DCC value is determined, based at least in part on the first number. The DCC value can be determined, for example, by dividing the first number by two, four, or another number.

In step 1603, a delay value is determined. The delay value can be, for example, a set delay provided by a PLD user. In some embodiments, the set delay value is compared with a maximum value. If the set delay does not exceed the maximum value, the set delay value is selected as the delay value. If the set delay exceeds the maximum value, the maximum value is selected as the delay value.

In some embodiments, the maximum value is determined by dividing the first number by two, by four, or by another number. In some embodiments, the maximum value is determined by adding together one-half of the first number and one-quarter of the first number. In some embodiments, the maximum value is determined by subtracting a predetermined value from the first number. In some embodiments, the maximum value is independent of the first number.

In step 1604, a second number of counts is counted following each initial edge of the input clock signal, and the second number is compared with the delay value.

In step 1605, a first edge is provided on an output clock signal when the second number reaches the delay value. In some embodiments, the first edges are rising edges.

In step 1606, a third number of counts is counted following each first edge on the output clock signal, and the third number is compared with the DCC value.

In step 1607, a second edge is provided on the output clock signal when the third number reaches the DCC value. In some embodiments (i.e., where the first edges are rising edges), the second edges are falling edges.

In some embodiments, counting the first number of counts is repeated every M periods of the input clock signal, where M is an integer. In some embodiments, M is five.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in non-programmable integrated circuits, or in printed circuit boards including discrete devices.

Further, inverters, logical OR gates, NOR gates, XNOR gates, NAND gates, flip-flops, counter circuits, maximum value circuits, counters, oscillators, registers, output clock generators, dividers, adders, decrementers, multiplexers, comparators, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system comprising a phase shifter circuit, the phase shifter circuit comprising:
   an input clock terminal;
   an output clock terminal;
   an inverter having an input terminal coupled to the input clock terminal and an output terminal;
   a first counter circuit having a clock terminal coupled to the input clock terminal and a plurality of output terminals;
   a register having a plurality of data input terminals coupled to the output terminals of the first counter circuit, a clock terminal coupled to receive a clock update signal from the first counter circuit, and a plurality of output terminals;
   a second counter circuit having a clock start terminal coupled to the input clock terminal, a plurality of clock stop terminals coupled to the output terminals of the register, and an output terminal;
   a third counter circuit having a clock start terminal coupled to the output terminal of the inverter, a plurality of clock stop terminals coupled to the output terminals of the register, and an output terminal; and
   an output clock generator having a first input terminal coupled to the output terminal of the second counter circuit, a second input terminal coupled to the output terminal of the third counter circuit, and an output terminal coupled to the output clock terminal.

2. The system of claim 1, wherein the register is one of a divide-by-two register and a divide-by-four register.

3. The system of claim 1, wherein the phase shifter circuit further comprises a maximum value circuit coupled between the output terminals of the register and the clock stop terminals of the second and third counter circuits.

4. The system of claim 3, wherein the maximum value circuit comprises:
   a plurality of set delay input terminals;
   a comparator having a first plurality of input terminals coupled to the set delay input terminals, a second plurality of input terminals coupled to the output terminals of the register, and an output terminal; and a multiplexer having a first plurality of input terminals coupled to the output terminals of the register, a second plurality of input terminals coupled to the set delay input terminals, a select input terminal coupled to the output terminal of the comparator, and a plurality of output terminals coupled to the clock stop terminals of the second and third counter circuits.

5. The system of claim 1, further comprising an adder circuit coupled between the first counter circuit and the register.

6. The system of claim 1, further comprising a decrementer circuit coupled between the first counter circuit and the register.

7. The system of claim 1, wherein the first counter circuit comprises:
a first oscillator circuit having an input terminal coupled to the input clock terminal and further having an output terminal; and
a first counter having an input terminal coupled to the output terminal of the first oscillator circuit and further having a plurality of output terminals coupled to the data input terminals of the register.

8. The system of claim 7, wherein the second and third counter circuits each comprise:
a second oscillator circuit having an input terminal coupled to the input clock terminal and further having an output terminal, the second oscillator circuit being implemented to oscillate with the same frequency as the first oscillator circuit;
a second counter having an input terminal coupled to the output terminal of the second oscillator circuit and further having a plurality of output terminals; and
a comparator having a first set of input terminals coupled to the output terminals of the register, a second set of input terminals coupled to the output terminals of the second counter, and an output terminal coupled to a corresponding one of the first and second input terminals of the output clock generator.

9. The system of claim 1, wherein the phase shifter circuit further comprises a reset input terminal coupled to reset input terminals of the first counter circuit, the register, the second counter circuit, and the third counter circuit.

10. The system of claim 1, wherein the output clock generator comprises a set input terminal coupled to the output terminal of the second counter circuit, a reset input terminal coupled to the output terminal of the third counter circuit, and an output terminal coupled to the output clock terminal.

11. The system of claim 10, wherein the output clock generator comprises a flip-flop having a data input terminal coupled to power high VDD, a clock terminal coupled to the output terminal of the second counter circuit, a reset terminal coupled to the output terminal of the third counter circuit, and an output terminal coupled to the output clock terminal.

12. The system of claim 1, wherein the first counter circuit comprises means for resetting itself after each M input clock periods, wherein M is an integer.

13. The system of claim 12, wherein M is five.

14. The system of claim 1, wherein the system comprises a programmable logic device (PLD), and the phase shifter circuit is implemented using programmable logic of the PLD.

15. The system of claim 14, wherein the PLD is one of a field programmable gate array (FPGA) and a complex programmable logic device (CPLD).

16. A system comprising a phase shifter circuit, the phase shifter circuit comprising:
an input clock terminal;
an output clock terminal;
a first counter circuit having a clock terminal coupled to the input clock terminal and a plurality of output terminals;
a first register having a plurality of data input terminals coupled to the output terminals of the first counter circuit, a clock terminal coupled to receive a clock update signal from the first counter circuit, and a plurality of output terminals;
a second counter circuit having a clock start terminal coupled to the input clock terminal, a plurality of clock stop terminals coupled to the output terminals of the first register, and an output terminal;
a third counter circuit having a clock start terminal coupled to the output terminal of the second counter circuit, a plurality of clock stop terminals coupled to the output terminals of the first counter circuit, and an output terminal; and
an output clock generator having a first input terminal coupled to the output terminal of the second counter circuit, a second input terminal coupled to the output terminal of the third counter circuit, and an output terminal coupled to the output clock terminal.

17. The system of claim 16, wherein the first register is one of a divide-by-two register and a divide-by-four register.

18. The system of claim 16, wherein the clock stop terminals of the third counter circuit are coupled to the output terminals of the first counter circuit via the first register.

19. The system of claim 16, wherein the phase shifter circuit further comprises a second register, and wherein the clock stop terminals of the third counter circuit are coupled to the output terminals of the first counter circuit via the second register.

20. The system of claim 19, wherein the second register is a divide-by-two register.

21. The system of claim 16, wherein the phase shifter circuit further comprises a maximum value circuit coupled between the output terminals of the first register and the clock stop terminals of the second counter circuit.

22. The system of claim 21, wherein the maximum value circuit comprises:
a plurality of set delay input terminals;
a comparator having a first plurality of input terminals coupled to the set delay input terminals, a second plurality of input terminals coupled to the output terminals of the first register, and an output terminal; and
a multiplexer having a first plurality of input terminals coupled to the output terminals of the first register, a second plurality of input terminals coupled to the set delay input terminals, a select input terminal coupled to the output terminal of the comparator, and a plurality of output terminals coupled to the clock stop terminal of the second counter circuit.

23. The system of claim 16, further comprising an adder circuit coupled between the first counter circuit and the first register.

24. The system of claim 16, further comprising a decrementer circuit coupled between the first counter circuit and the first register.

25. The system of claim 16, further comprising a duty cycle correction (DCC) enable circuit coupled between the output terminal of the second counter circuit and the clock start terminal of the third counter circuit, and further coupled between the output terminals of the first counter circuit and the clock stop terminals of the third counter circuit.

26. The system of claim 16, wherein the first counter circuit comprises:
   a first oscillator circuit having an input terminal coupled to the input clock terminal and further having an output terminal; and
   a first counter having an input terminal coupled to the output terminal of the first oscillator circuit and further having a plurality of output terminals coupled to the data input terminals of the first register.

27. The system of claim 26, wherein the second and third counter circuits each comprise:
   a second oscillator circuit having an input terminal coupled to the input clock terminal and further having an output terminal, the second oscillator circuit being implemented to oscillate with the same frequency as the first oscillator circuit;
   a second counter having an input terminal coupled to the output terminal of the second oscillator circuit and further having a plurality of output terminals; and
   a comparator having a first set of input terminals coupled to the output terminals of the first register, a second set of input terminals coupled to the output terminals of the second counter, and an output terminal coupled to a corresponding one of the first and second input terminals of the output clock generator.

28. The system of claim 16, wherein the phase shifter circuit further comprises a reset input terminal coupled to reset input terminals of the first counter circuit, the first register, the second counter circuit, and the third counter circuit.

29. The system of claim 16, wherein the output clock generator comprises a set input terminal coupled to the output terminal of the second counter circuit, a reset input terminal coupled to the output terminal of the third counter circuit, and an output terminal coupled to the output clock terminal.

30. The system of claim 29, wherein the output clock generator comprises a flip-flop having a data input terminal coupled to power high VDD, a clock terminal coupled to the output terminal of the second counter circuit, a reset terminal coupled to the output terminal of the third counter circuit, and an output terminal coupled to the output clock terminal.

31. The system of claim 16, wherein the first counter circuit comprises means for resetting itself after each M input clock periods, wherein M is an integer.

32. The system of claim 31, wherein M is five.

33. The system of claim 16, wherein the system comprises a programmable logic device (PLD), and the phase shifter circuit is implemented using programmable logic of the PLD.

34. The system of claim 33, wherein the PLD is one of a field programmable gate array (FPGA) and a complex programmable logic device (CPLD).

35. A method of providing a phased output clock signal from an input clock signal, the method comprising:
   counting a first number of counts between two successive initial edges of the input clock signal;
   determining a delay value based at least in part on the first number;
   counting a second number of counts following each initial edge of the input clock signal and comparing the second number with the delay value;
   providing a first edge on the output clock signal when the second number reaches the delay value;
   counting a third number of counts following each following edge of the input clock signal and comparing the third number with the delay value; and
   providing a second edge on the output clock signal when the third number reaches the delay value.

36. The method of claim 35, wherein determining a delay value based at least in part on the first number comprises:
   determining a maximum value based at least in part on the first number;
   comparing a set delay with the maximum value;
   selecting the set delay as the delay value if the set delay does not exceed the maximum value; and
   selecting the maximum value as the delay value if the set delay exceeds the maximum value.

37. The method of claim 36, wherein determining a maximum value based at least in part on the first number comprises dividing the first number by two to obtain the maximum value.

38. The method of claim 36, wherein determining a maximum value based at least in part on the first number comprises dividing the first number by four to obtain the maximum value.

39. The method of claim 36, wherein determining a maximum value based at least in part on the first number comprises adding together one-half of the first number and one-quarter of the first number to obtain the maximum value.

40. The method of claim 36, wherein determining a maximum value based at least in part on the first number comprises subtracting a predetermined value from the first number to obtain the maximum value.

41. The method of claim 35, wherein counting a first number of counts between two successive initial edges of the input clock signal is repeated every M periods of the input clock signal, wherein M is an integer.

42. The method of claim 41, wherein M is five.

43. The method of claim 35, wherein the steps of the method are performed by a circuit implemented in a programmable logic device (PLD).

44. The method of claim 43, wherein the PLD is one of a field programmable gate array (FPGA) and a complex programmable logic device (CPLD).

45. The method of claim 35, wherein the first edges and the initial edges are both rising edges, and the second edges and the following edges are both falling edges.

46. A method of providing a phased output clock signal from an input clock signal, the method comprising:
   counting a first number of counts between two successive initial edges of the input clock signal;
   determining a duty cycle correction (DCC) value based at least in part on the first number;
   determining a delay value;
   counting a second number of counts following each initial edge of the input clock signal and comparing the second number with the delay value;
   providing a first edge on the output clock signal when the second number reaches the delay value;
   counting a third number of counts following each first edge on the output clock signal and comparing the third number with the DCC value; and
   providing a second edge on the output clock signal when the third number reaches the DCC value.

47. The method of claim 46, wherein determining a DCC value based at least in part on the first number comprises dividing the first number by one of two and four to obtain the DCC value.

48. The method of claim 46, wherein determining a delay value comprises:
   determining a maximum value;
   comparing a set delay with the maximum value;
   selecting the set delay as the delay value if the set delay does not exceed the maximum value; and
   selecting the maximum value as the delay value if the set delay exceeds the maximum value.

49. The method of claim 48, wherein determining a maximum value comprises dividing the first number by two to obtain the maximum value.

50. The method of claim 48, wherein determining a maximum value comprises dividing the first number by four to obtain the maximum value.

51. The method of claim 48, wherein determining a maximum value comprises adding together one-half of the first number and one-quarter of the first number to obtain the maximum value.

52. The method of claim 48, wherein determining a maximum value comprises subtracting a predetermined value from the first number to obtain the maximum value.

53. The method of claim 46, wherein counting a first number of counts between two successive initial edges of the input clock signal is repeated every M periods of the input clock signal, wherein M is an integer.

54. The method of claim 53, wherein M is five.

55. The method of claim 46, wherein the steps of the method are performed by a circuit implemented in a programmable logic device (PLD).

56. The method of claim 55, wherein the PLD is one of a field programmable gate array (FPGA) and a complex programmable logic device (CPLD).

57. The method of claim 46, wherein the first edges and the initial edges are both rising edges, and the second edges and the following edges are both falling edges.

* * * * *